United States Patent [19]

Umeda et al.

[11] Patent Number: 4,643,131

[45] Date of Patent: Feb. 17, 1987

[54] COMBINED CONTINUOUS PLATING APPARATUS FOR HOT-DIP PLATING AND VACUUM DEPOSITION PLATING

[75] Inventors: Shozo Umeda, Tokyo; Norio Tsukiji, Sakai; Takuya Aiko, Sakai; Toshiharu Kittaka, Sakai; Heizaburo Furukawa, Hiroshima; Kanji Wake, Hiroshima; Yoshio Shimozato, Hiroshima; Kenichi Yanagi, Hiroshima; Mitsuo Kato, Hiroshima; Tetsuyoshi Wada, Hiroshima, all of Japan

[73] Assignees: Nisshin Steel Company, Ltd.; Mitsubishi Jukogyo Kabushiki Kaisha, both of Tokyo, Japan

[21] Appl. No.: 778,386

[22] Filed: Sep. 20, 1985

[30] Foreign Application Priority Data

Sep. 28, 1984 [JP] Japan .................................. 59-201423

[51] Int. Cl.⁴ ............................................. C23C 13/08
[52] U.S. Cl. ..................................... 118/718; 118/733; 118/420; 427/329; 427/433
[58] Field of Search ...................... 118/718, 733, 420; 427/329, 433

[56] References Cited

U.S. PATENT DOCUMENTS

| | | | |
|---|---|---|---|
| 2,797,476 | 7/1957 | Sendzimir | 427/329 |
| 3,860,444 | 1/1975 | Donckel | 118/718 |
| 3,868,106 | 2/1975 | Donckel | 118/733 |

Primary Examiner—Richard Bueker
Attorney, Agent, or Firm—Webb, Burden, Robinson & Webb

[57] ABSTRACT

Disclosed is a combined continuous plating apparatus for hot-dip plating and vacuum deposition plating characterized in that the outlet of the gas reduction annealing furnace of a conventional continuous hot-dip plating apparatus and the inlet of the seal roll chamber of a known continuous vacuum deposition plating apparatus are connected through a pressurized chamber in order to prevent invasion of hydrogen-containing reduction gas into the vacuum deposition chamber, whereby is prevented the possibility of the hydrogen-containing gas causing an explosion should air leak into the vacuum deposition chamber.

4 Claims, 3 Drawing Figures

COMBINED CONTINUOUS PLATING APPARATUS FOR HOT-DIP PLATING AND VACUUM DEPOSITION PLATING

FIELD OF THE INVENTION

This invention relates to an apparatus for continuously plating sheet steel. More particularly, this invention relates to a combined continuous plating apparatus with which both hot-dip plating and vacuum deposition plating can be carried out.

BACKGROUND OF THE INVENTION

Three methods are known for plating the surface of steel sheet with zinc, aluminum or the like, hot-dip plating, electrolytic plating and vacuum deposition plating. Among these, electrolytic plating is outside of the contemplation of the present invention, because it requires use of electricity. In the hot-dip plating method which is widely employed in industry today, the steel strip is heated to about 700° C. in a hydrogen-containing gas (usually a mixture of hydrogen and nitrogen) so as to activate the surface thereof and is simultaneously annealed, and thereafter is dipped in a molten metal bath for plating. Control of the coating amount is effected by gas wiping; that is, a gas such as air is blown from a plurality of nozzles onto the film of molten metal covering the strip surface immediately after the strip comes out of the bath, whereby the gas flow rate, the gas pressure, the distance between the nozzles and the steel strip, etc. are regulated to obtain a coating of desired thickness. There are following problems in the hot-dip plating method: (1) It is difficult to control the coating amount to less than about 30 g/m² by currently available gas-wiping techniques. Therefore, galvanized steel sheet with a coating weight of less than 30 g/m² is conventionally manufactured by the electrolytic plating method. (2) It is difficult to manufacture steel sheet plated only on one side or plated to different thicknesses on opposite sides, since the steel strip is dipped in a plating bath. Steel sheets plated on only one side can be manufactured by first coating both sides and then removing the coating from one side or by plating steel sheet which is coated on one side with an agent which prevents plating and removing the agent after plating. However, both methods are complicated in procedure and is uneconomical. It is considered to manufacture steel sheet plated to different thicknesses on opposite sides by using different gas blowing conditions for the respective side in the gas wiping step to regulate the molten metal adhering to the strip to different thicknesses. However, it is practically impossible because the steel strip vibrates and the distance between the nozzles and the strip cannot be satisfactorily regulated.

In contrast, the vacuum deposition plating method has following features: (1) Both single-side and double-side plating can be easily carried out, since each side of the steel strip is deposition-plated with metal vapor separately. When both sides of a strip are plated, platings of different thickness can easily be effected by changing the deposition conditions on the respective sides. (2) Thin plating can be carried out at high speed. However, it is difficult to obtain as thick a plating as can be obtained by the hot dip plating method. This is because when the deposition metal is deposited on the surface of the steel strip, the temperature of the strip is raised by the latent heat of solidification and the steel and the deposited metal are alloyed by interdiffusion, and thus the workability of the plated steel sheet is impaired. For instance, when a 0.3 mm thick substrate steel sheet is zinc-plated on both sides at 250° C. at a coating weight of 100 g/m², the temperature of the steel substrate is raised by about 300° C. to about 550° C. by the latent heat of solidification, and thus the steel and zinc are alloyed. (In the case of thin plating, the temperature does not rise so much.)

Therefore, hot-dip plating and vacuum deposition plating must properly be selectively used in accordance with the desired product. However, apparatuses for carrying out the two methods are entirely different and are usually installed at separate locations. It would be convenient if the two types of apparatus could be combined into a single apparatus which could be selectively switched over for carrying out either plating method.

Combination of a continuous hot-dip plating apparatus and a continuous vacuum deposition apparatus can be achieved by connecting the gas reduction annealing furnace of a gas reduction annealing continuous hot-dip plating apparatus to the vacuum deposition chamber of a continuous vacuum deposition plating apparatus. However, if the gas reduction annealing furnace of a gas reduction continuous hot-dip plating apparatus is directly connected to the vacuum deposition chamber of a continuous vacuum deposition apparatus, the hydrogen-containing gas in the gas reduction annealing furnace will be sucked into the vacuum deposition chamber. Therefore, there is a danger of explosion if leak should occur allowing air to be drawn into the vacuum deposition chamber. This invention is intended to solve this problem and thus to enable combination of a continuous hot-dip plating apparatus and a continuous vacuum deposition apparatus.

The problem described above can be solved by providing at the outlet of the gas reduction annealing furnace a pressurized chamber, which can be maintained at a pressure higher than the inside pressure of the gas reduction annealing furnace.

SUMMARY OF THE INVENTION

This invention provides a combined continuous plating apparatus for hot-dip plating and vacuum deposition plating characterized in that the outlet of the gas reduction annealing surface of a gas reduction annealing continuous hot-dip plating apparatus and the inlet of the seal roll chamber of a continuous vacuum deposition plating apparatus are connected through a pressurized chamber.

Preferably, the pressurized chamber is detachably connected. Also the gas reduction furnace and the pressurized chamber are preferably connected by a detachable duct means. Further, the pressurized chamber is preferably provided with a pressure regulation escape valve.

The invention will now be described specifically with reference to the attached drawings.

DETAILED DESCRIPTION OF THE INVENTION

Figure 1:
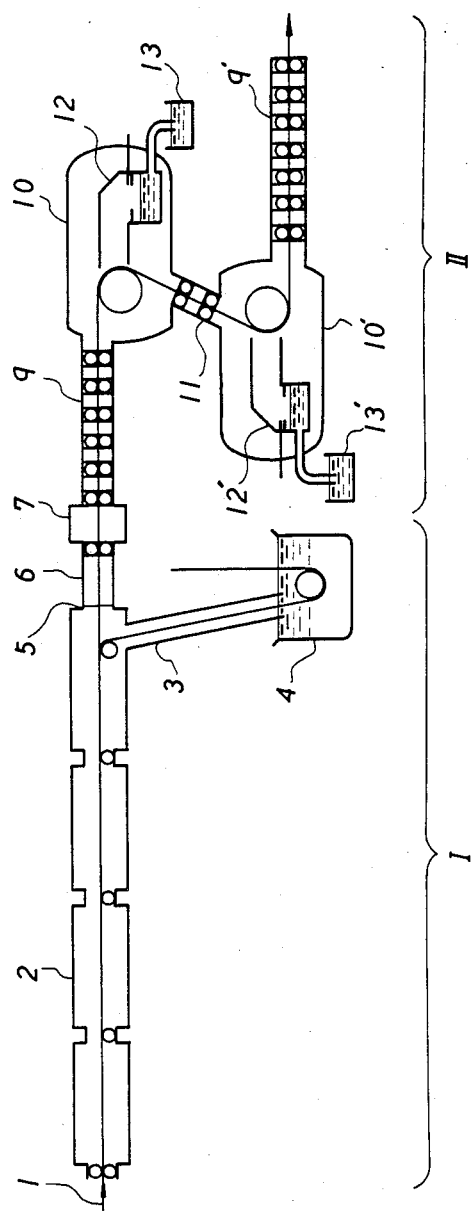
FIG. 1 is a schematic longitudinal cross-sectional view showing the concept of the apparatus of this invention.

In FIG. 1, the continuous hot-dip plating apparatus I is, for instance, a Zendzimir type continuous hot-dip plating apparatus. A snout 3 is provided in the gas reduction annealing furnace 2 at the bottom near the outlet 5 thereof. The end of the snout is immersed in a molten metal plating bath 4. Such an apparatus is well known among those skilled in the art and is for instance, described in the July 1958 issue of "Metal Industry".

A steel strip 1 is continuously introduced into the gas reduction annealing furnace from the left side inlet, cleaned by removing oxides on the surface thereof, simultaneously annealed, and it is immersed into a molten metal plating bath 4.

The continuous vacuum deposition plating apparatus II has been developed relatively recently, and several types have been proposed. One of them is disclosed in Japanese Laid-Open Patent Publication No. 113179/84. The one illustrated here comprises two vacuum deposition chambers 10 and 10', seal roll chambers 9 and 9' respectively attached to each of the vacuum deposition chambers and another seal roll chamber 11 disposed between the two vacuum deposition chambers. The vacuum deposition chambers 10, 10' are evacuable chambers housing evaporation apparatuses 12, 12' to which molten metal is supplied from melting vessels 13, 13' placed outside of the vacuum deposition chambers. The chambers are kept at a reduced pressure and is heated by a suitable means such as an electric resistance heater, electron beam heater, or the like (not shown).

In the illustrated apparatus, there are two vacuum deposition chambers, one disposed above and the second below. But the two chambers may be disposed so that the second chamber is located above the first, or the two chambers are on the same level. Only one vacuum deposition chamber will suffice if only one side is to be plated and plating on both sides is not considered.

Figure 2:
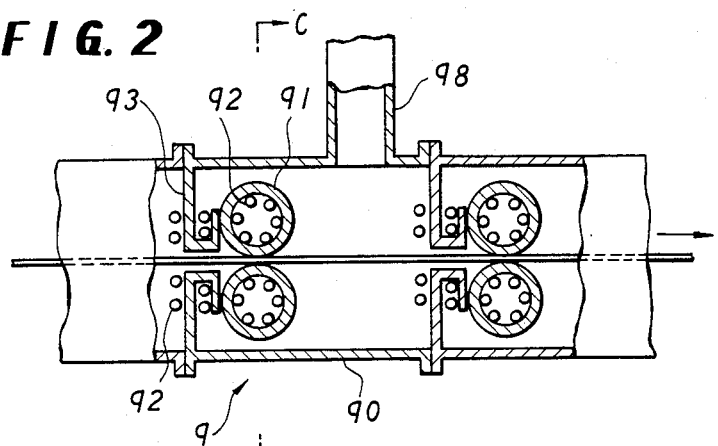
FIGS. 2 and 3 are cross-sectional views showing seal roll means of an example of a continuous vacuum deposition plating apparatus to be incorporated in the apparatus of this invention.
Figure 3:
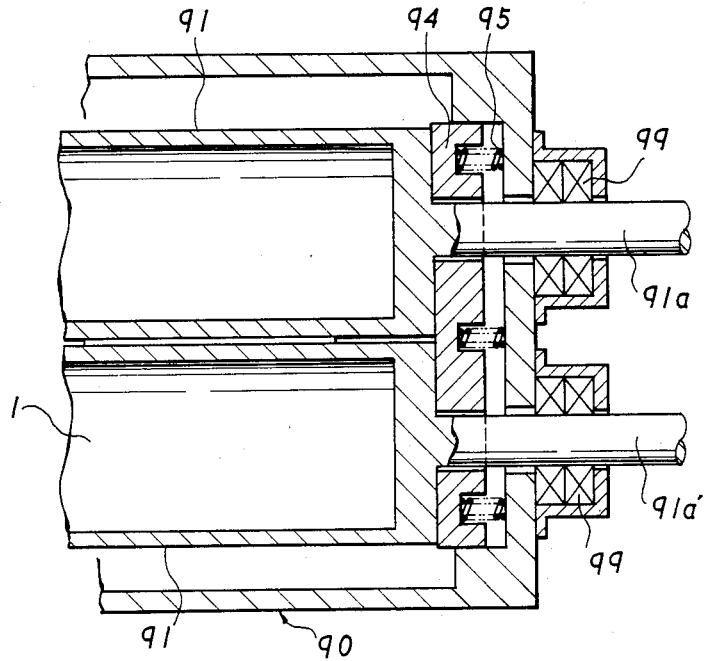

The seal roll chambers 9 and 9' are means for continuously introducing and drawing out a steel strip while maintaining the vacuum of the vacuum deposition chambers and are, for instance, of the structure as illustrated in FIGS. 2 and 3, which is described in detail in copending application Ser. No. 713743. FIG. 2 is a longitudinal cross-sectional view of a seal roll chamber. In this case, the seal roll chamber is an elongated box of a rectangular cross section and comprises a plurality of unit casings 90 which are respectively provided with a pair of pinch rolls 91 supported by the side walls, a sealing walls 93 and an evacuation duct 98.

The illustrated sealing wall 93 is of an eave-trough shape, the edge of which is positioned as close as possible to the pinch roll 91. Heating means 92 may be provided in the sealing walls and pinch rolls in order to avoid deposition of metal vapor.

Both ends of the pinch rolls (sealing rolls) are constructed for instance, as shown in FIG. 3, which is a cross-sectional view along line C—C in FIG. 2. A rotation shaft 91a of the roll extends outside through the casing wall and is supported by a bearing which is provided with a shaft seal 99. At least the parts of the shaft seal 99 which contact the shaft 91a are clad with a known scorch-proof material such as metal, carbon, carbon fiber, etc. Between the end face of the roll and the inside wall of the casing, is provided a side plate 94 pressed by springs 95 inserted between the casing wall and the side plate so that gas-tight sealing is maintained. The contacting part of the side plate is clad in the same manner as mentioned above.

By connecting a plurality of such unit casings, maximum prevention of leakage of the deposition chamber can be achieved.

The seal roll chamber 11 between the vacuum deposition chambers 10 and 10' is constructed in the same manner.

A steel strip 1 enters the first vacuum deposition chamber 10 through the seal roll chamber 9, and is plated on its upper side and proceeds to the second vacuum deposition chamber 10' wherein the lower side is plated, and then egresses the apparatus through the seal roll chamber 9'. Vacuum deposition conditions can be varied in the two chambers so as to form platings of different thickness.

This invention is characterized by connecting the above-described continuous hot-dip plating apparatus and the continuous vacuum deposition plating apparatus through a pressurized chamber 7. The pressurized chamber 7 is constructed to be detachable, and more preferably it is connected to the outlet of the gas reduction annealing furnace by means of a connecting duct 6. The pressurized chamber 7 is a gas-tight box preferably provided with a pressure regulation valve (not shown), wherein an inert gas such as argon or nitrogen is introduced to pressurize the chamber to a higher pressure than the inside pressure of the gas reduction annealing furnace. A portion of the inert gas flows into the gas reduction annealing furnace and a small portion enters the seal roll chamber and the excess portion is released through the pressure regulation escape valve (if provided). However, the reduction gas never penetrates into the seal roll chamber or the vacuum deposition chamber.

The pressurized chamber is connected with the gas-reduction annealing furnace (the connecting duct) and the vacuum deposition chamber (the seal roll chamber) by bolts or clamps with a suitable gasket material inserted therebetween. If the apparatus is designed with the second vacuum deposition chamber disposed above the first vacuum deposition chamber and so that the hot-dip plated steel strip can be drawn out horizontally, that is, rightward in the drawing, instead of upward, the pressurized chamber need not necessarily be detachable.

As the apparatus of this invention is constructed as described above, there is no penetration of hydrogen-containing gas into the vacuum deposition chamber. Therefore, even if some air leaks into the vacuum deposition chamber, the apparatus will still be entirely free from the danger of explosion.

EMBODIMENT OF THE INVENTION

An apparatus substantially as illustrated in FIG. 1 was constructed on an experimental basis. The overall length of the gas-reduction annealing furnace was about 25 m, while the seal roll chamber comprised seven unit casings and had an overall length of about 11 m. The apparatus was made of carbon steel plate by welding. The connecting duct was about 9.5 m in length. The outlet of the gas-reduction annealing furnace and the pressurized chamber were fixed together by securing their flanges with bolts with gaskets inserted therebetween.

The hot-dip continuous plating apparatus is known per se. The continuous vacuum deposition plating apparatus was a typical one disclosed in the above-mentioned Japanese Laid-Open Patent Publication No. 113179/84. Those skilled in the art can therefore easily construct this apparatus by referring to these disclosures.

Zinc plating was carried out using the above-mentioned apparatus. The conditions were as follows:

Steel strip: Plain carbon steel, 0.6 mm thick × 300 mm wide
Line speed: 15 m/min
Hot-dip plating:
  Reduction gas composition: 75% $H_2$- 25% $N_2$ (volume)
  Gas reduction annealing furnace temp.: 700° C. (temperature of strip)
  Plating bath composition: Commercially available distilled zinc plus 0.18% aluminum
  Plating bath temperature: 450°-550° C.
Vacuum deposition plating:
  Zinc: Commercially available electrolyzed zinc
  Deposition temperature: 460°-470° C.
  Pressurizing gas: $N_2$
  Pressure of pressurized chamber: Atmospheric pressure plus 3-10 mm $H_2O$
  Evacuation of deposition chamber: 0.01-0.1 Torr.
  Strip temperature: 190°-280° C.

Initially, the pressurized chamber and the gas reduction annealing chamber were separated by detaching the connecting duct, and hot dip plating was carried out. As the connecting duct was removed, the plated strip was lifted upward for the final treatment. The same results as with the ordinary hot-dip plating apparatus were obtained.

Subsequently, the connecting duct was put in place to connect the gas reduction annealing furnace and the pressurized chamber. Thus the apparatus was switched over to vacuum deposition plating, and the plating was carried out. The same results as obtained with an independent vacuum deposition plating apparatus were obtained.

We claim:

1. A combined continuous plating apparatus for hot-dip plating and vacuum deposition plating characterized in that the outlet of the gas reduction annealing furnace of a gas reduction annealing continuous hot-dip plating apparatus and the inlet of the seal roll chamber of a continuous vacuum deposition plating apparatus are connected through a pressurized chamber.

2. The apparatus recited in claim 1, wherein the pressurized chamber is detachable.

3. The apparatus recited in claim 2, wherein the outlet of the gas reduction furnace and the pressurized chamber are connected by means of a detachable duct means.

4. The apparatus recited in claim 1 or 2, wherein the pressurized chamber is provided with a pressure-regulation escape valve.

* * * * *